(12) United States Patent
Marathe et al.

(10) Patent No.: US 6,599,835 B1
(45) Date of Patent: Jul. 29, 2003

(54) TESTING DIELECTRIC AND BARRIER LAYERS FOR INTEGRATED CIRCUIT INTERCONNECTS

(75) Inventors: Amit P. Marathe, Milpitas, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/905,470

(22) Filed: Jul. 13, 2001

(51) Int. Cl.[7] .............................................. H01L 21/44
(52) U.S. Cl. .................. 438/678; 438/629; 438/637; 438/687; 257/48; 257/750; 257/751; 257/756; 257/763; 257/767
(58) Field of Search .......................... 438/14, 17, 622, 438/624, 625, 627, 629, 637, 648, 656, 672, 675, 685, 687, 688, 643, 653, 678, 618, 620, 626, 642, 650, 652, 658; 257/48, 750, 751, 756, 760–763, 767, 774; 204/192.17

(56) References Cited

U.S. PATENT DOCUMENTS 4,976,839 A * 12/1990 Inoue ..................... 204/192.17
6,294,396 B1 * 9/2001 Nogami et al. ............... 438/16

* cited by examiner

*Primary Examiner*—Matthew Smith
*Assistant Examiner*—V. Yevsikov
(74) *Attorney, Agent, or Firm*—Mikio Ishimaru

(57) ABSTRACT

An integrated circuit test system and method therefor is provided having a semiconductor substrate with an electrical ground and a source of electrical potential. A dielectric layer with first and second openings is formed on the semiconductor substrate. First and second barrier layers are deposited on the dielectric layer to line the openings. A first conductor core is deposited over the first barrier layer to fill the first opening and is connected to a source of electrical potential. A second conductor core is deposited over the second barrier layer to fill the second opening and is connected to the electrical ground. A current measuring device is provided to measure leakage current flow between the first and second conductor cores.

12 Claims, 2 Drawing Sheets

TESTING DIELECTRIC AND BARRIER LAYERS FOR INTEGRATED CIRCUIT INTERCONNECTS

TECHNICAL FIELD

The present invention relates generally to semiconductor technology and more specifically characterizing dielectric and barrier layer integrity during the manufacturing of integrated circuits.

BACKGROUND ART

In the manufacture of integrated circuits, after the individual devices such as the transistors have been fabricated in and on a semiconductor substrate or wafer, they must be connected, or "wired" together to perform the desired circuit functions. This interconnection process is generally called "metallization" and is performed using a number of different photolithographic, deposition, and removal processes to create contacts to the transistors, wire/channels to the contacts, and vias interconnecting the channels where there are more than one level of channels.

There are a number of different metalization techniques, but generally, a device dielectric layer is deposited over the transistors, openings are formed through the device dielectric layer down to transistor junctions and gates, and the openings are filled with a conductive metal to form contacts.

In one technique called the "single damascene" or "single inlaid" process, the formation of the first channels starts with the deposition of a thin first channel stop layer on the device dielectric layer. The first channel stop layer is an etch stop layer which is subject to a photolithographic processing step which involves deposition, patterning, exposure, and development of a photoresist, and an anisotropic etching step through the patterned photoresist to provide openings to the contacts. The photoresist is then stripped.

A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched. The first channel dielectric layer is then subject to further photolithographic process and etching steps to form first channel openings in the pattern of the first channels. The photoresist is then stripped.

An optional thin adhesion layer is deposited on the first channel dielectric layer over the entire semiconductor wafer and lines the first channel openings to ensure good adhesion of subsequently deposited material to the first channel dielectric layer. The adhesion layer is a metal such as tungsten (W), titanium (Ti), or tantalum (Ta).

High conductivity metals, such as copper (Cu), diffuse easily through dielectric materials such as silicon oxide and silicon nitride. This diffusion can result in a conductive buildup and cause short circuits in the integrated circuits. To prevent diffusion, a diffusion barrier is deposited on the adhesion layer. For copper conductor materials, the diffusion barrier layer is composed of materials such as tantalum nitride (TaN), titanium nitride (TiN), or tungsten nitride (WN).

However, these nitride compounds have relatively poor adhesion to copper and relatively high electrical resistance so they are problematic. For simplicity, the adhesion and barrier layers are sometimes collectively referred to as a "barrier" layer herein.

For conductor materials, such as copper and copper alloys, which are deposited by electroplating, a seed layer is deposited on the barrier layer and lines the barrier layer in the first channel openings to act as an electrode for the electroplating process. Processes such as electroless, physical vapor, and chemical vapor deposition are used to deposit the seed layer.

A first conductor material is electroplated on the seed layer and fills the first channel opening. The first conductor material and the seed layer generally become integral, and are often collectively referred to as the conductor core when discussing the main current-carrying portion of the channels.

A chemical-mechanical polishing/planarization (CMP) process is then used to remove the first conductor material, the seed layer, and the barrier layer above the first channel dielectric layer so the materials and layers are coplanar with the dielectric layer. The CMP process leaves the first conductor "inlaid" in the first channel dielectric layer to form the first channels. When a thing dielectric layer is placed over the first channels as a final layer, it is called a "capping" layer and the single damascene process is completed. When the layer is processed further for placement of additional channels over it, the layer is a via stop layer.

In another technique called the "dual damnascene" or "dual inlaid" process, vias and channels are formed at the same time, generally over a completed single damascene process series of first channels. Effectively, two levels of channels of conductor materials in vertically separated planes are separated by an interlayer dielectric (ILD) layer and interconnected by the vias.

The initial step of the dual damascene process starts with the deposition of a thin via stop layer over the first channels and the first channel dielectric layer if it has not already been deposited as a capping layer. The via stop layer is an etch stop layer which is subject to photolithographic processing using a photoresist and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process using a photoresist and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, a seed layer is deposited on the barrier layer and lines the barrier layer in the second channel openings and the vias.

A second conductor material is electroplated on the seed layer and fills the second channel openings and the vias.

A CMP process is then used to remove the second conductor material, the seed layer, and the barrier layer above the second channel dielectric layer to form the second channels. When a layer is placed over the second channels as a final layer, it is called a "capping" layer and the dual damascene process is completed.

The layer may be processed further for placement of additional levels of channels and vias over it. Individual and multiple levels of single and dual damascene structures can be formed for single and multiple levels of channels and vias, which are collectively referred to as "interconnects".

The use of the single and dual damascene techniques eliminates metal etch and dielectric gap fill steps typically used in the metallization process for conductor metals such as aluminum. The elimination of metal etch steps is important as the semiconductor industry moves from aluminum (Al) to other metallization materials, such as copper, which are very difficult to etch.

A major problem occurs with highly conductive materials, such as copper, which diffuse easily through dielectric materials. In order to prevent diffusion, these conductor core materials are surrounded by diffusion barrier materials of various types, which are deposited in various different ways. It has been very difficult to determine out how to measure the characteristics of the various combinations of diffusion barrier materials and the dielectrics in which they are embedded. This is especially true between various levels of channels.

Solutions to this problem have been long sought but have long eluded those skilled in the art.

DISCLOSURE OF THE INVENTION

The present invention provides an integrated circuit test system and method therefor. A semiconductor substrate, an electrical ground, and a source of electrical potential are provided. A dielectric layer with first and second openings is formed on the semiconductor substrate. First and second barrier layers are deposited on the dielectric layer to line the openings. A first conductor core is deposited over the first barrier layer to fill the first opening and is connected to a source of electrical potential. A second conductor core is deposited over the second barrier layer to fill the second opening and is connected to the electrical ground. A current measuring device is provided to measure leakage current flow between the first and second conductor cores. This has resulted in a very simple system for characterizing barrier and dielectric layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
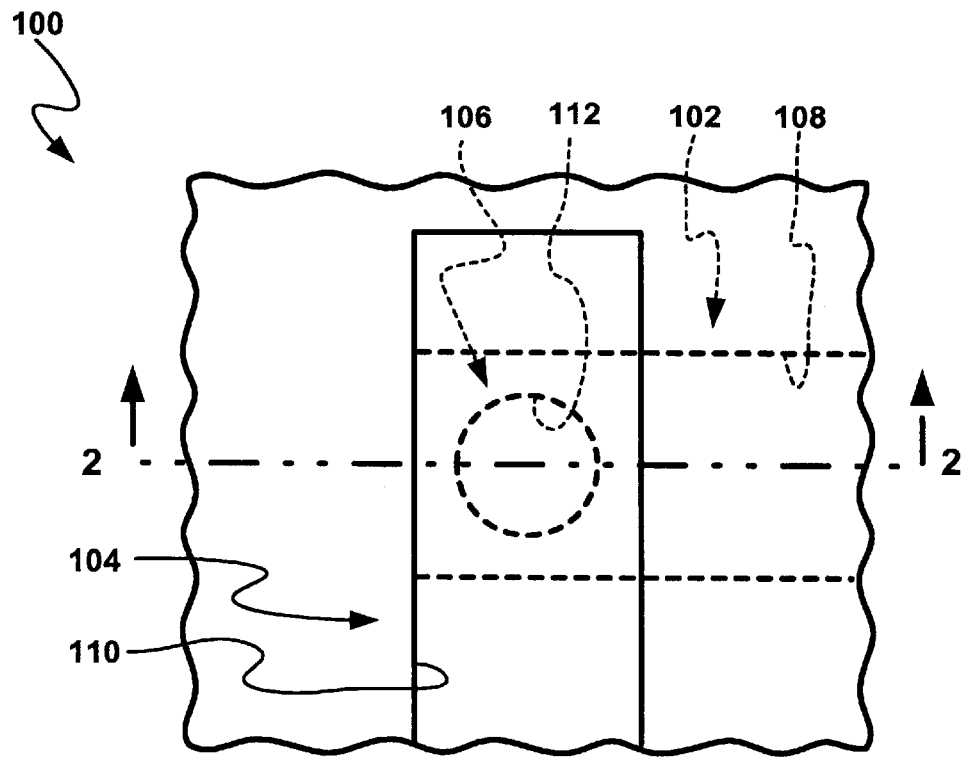
FIG. 1 (PRIOR ART) is a plan view of aligned channels with a connecting via.

Referring now to FIG. 1 (PRIOR ART), therein is shown a plan view of a semiconductor wafer 100 including a silicon semiconductor substrate (not shown) having as interconnects first and second channels 102 and 104 connected by a via 106. The first and second channels 102 and 104 are respectively disposed in first and second channel dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
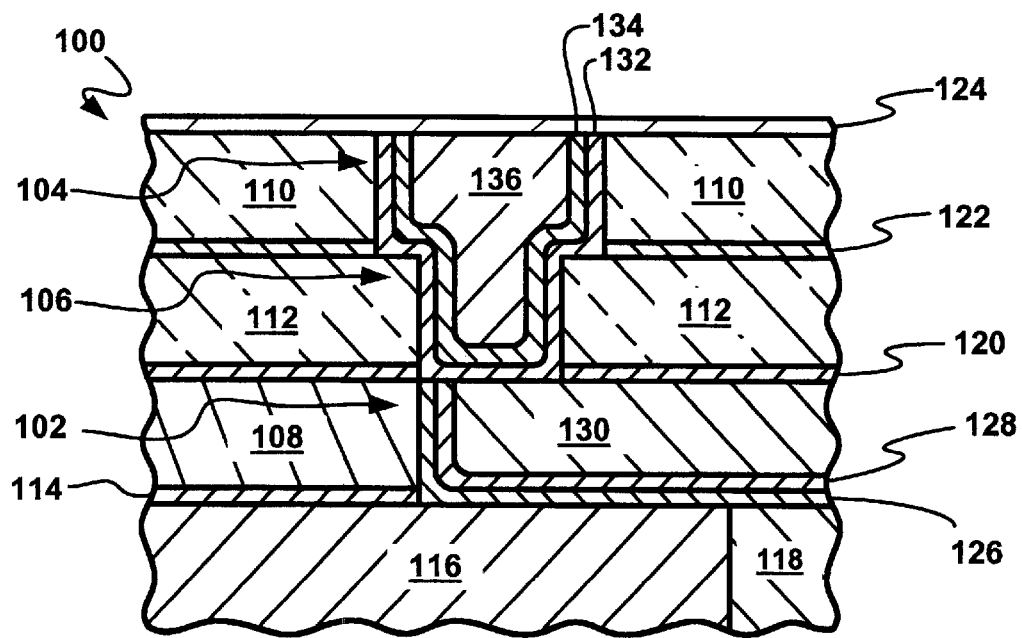
FIG. 2 (PRIOR ART) is a close up cross-section of a semiconductor wafer FIG. 1 (PRIOR ART) along line 2—2.

Referring now to FIG. 2 (PRIOR ART) therein is shown a cross-section of FIG. 1 (PRIOR ART) along line 2—2. A portion of the first channel 102 is disposed in a first channel stop layer 114 and is on a device dielectric layer 116, which is on the silicon semiconductor substrate. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a capping or via stop layer 124.

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material as the conductor cores 130 and 136 and become part of the respective conductor cores 130 and 136 after the deposition.

A major problem occurs with highly conductive materials, such as copper, which diffuse easily through dielectric materials. In order to prevent diffusion, these conductor core materials are surrounded by diffusion barrier materials of various types, which are deposited in various different ways. It has been very difficult to determine out how to measure the characteristics of the various combinations of diffusion barrier materials and the dielectrics in which they are embedded. This is especially true between various levels of channels.

Figure 3:
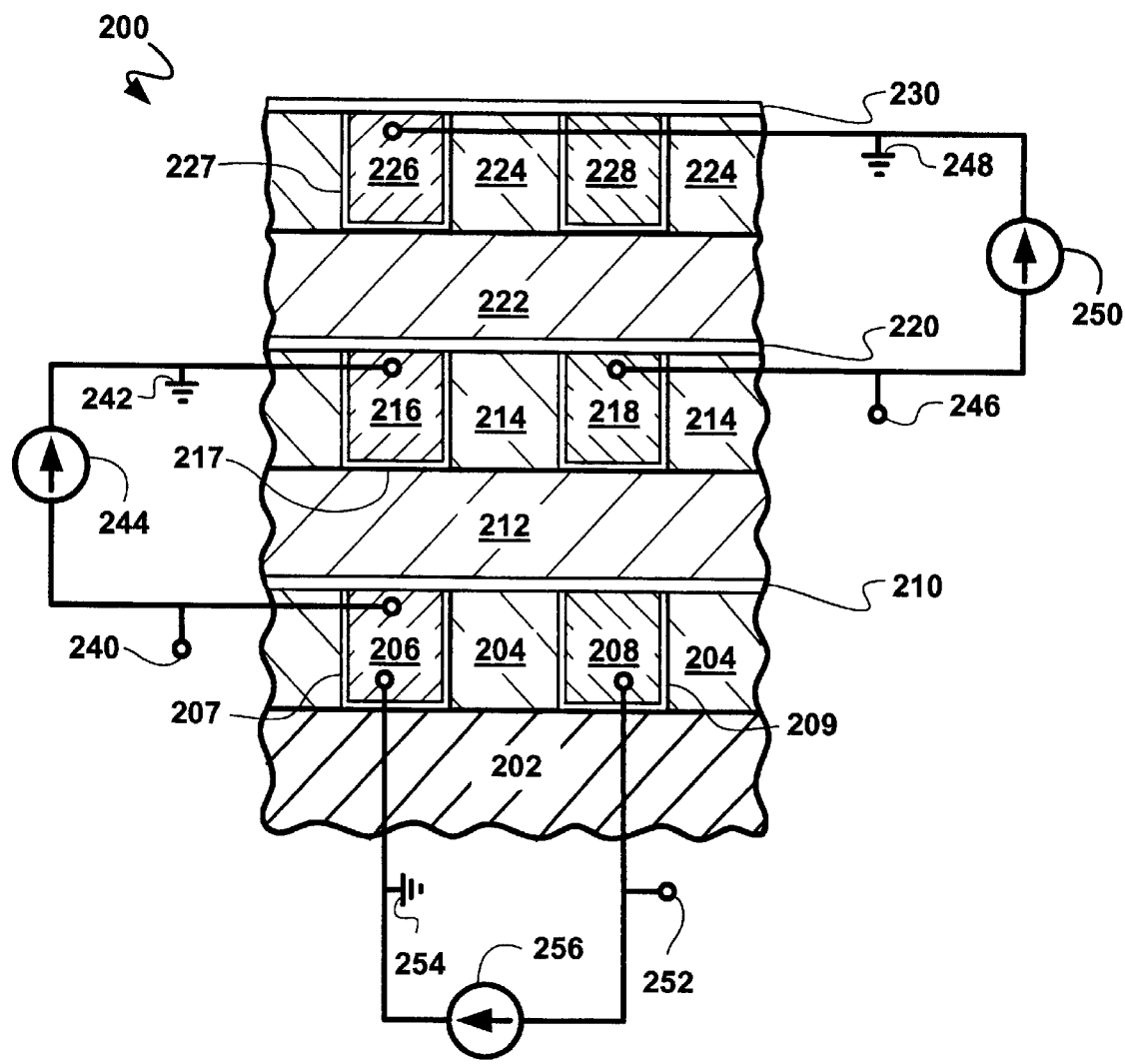
FIG. 3 is a close up cross-section of a semiconductor wafer similar to the semiconductor wafer of FIG. 1 (PRIOR ART).

Referring now to FIG. 3, therein is shown a close up cross-section of a semiconductor wafer 200 similar to the semiconductor wafer 100 of FIG. 1 (PRIOR ART). The semiconductor wafer 200 includes a silicon semiconductor substrate 202 having a first channel dielectric layer 204 disposed thereon. The first channel dielectric layer 204 has been processed by a single damascene process to create the first channels 206 and 208, which include respective first barrier layers 207 and 209. A first intermediate stop layer 210 is deposited over the first channel dielectric layer 204 and the first channels 206 and 208. A first intermediate dielectric layer 212 is deposited over the first intermediate stop layer 210.

A second channel dielectric layer 214 is deposited over the first intermediate dielectric layer 212 and is processed to provide second channels 216 and 218, which include barrier layers, of which a second barrier layer 217 of the second channel 216 is labeled. Depending on the type of test being performed, the second channels 216 and 218 may be deposited by a dual damascene technique so as to have vias but these are not shown so that the invention may be seen more clearly. A second intermediate dielectric layer 220 is deposited over the second channel dielectric layer 214 and the second channels 216 and 218.

A second intermediate dielectric layer 222 is deposited over the second intermediate dielectric layer 220.

A third channel dielectric layer 224 is deposited over the second intermediate dielectric layer 222. The third channel dielectric layer 224 is processed to form third channels 226 and 228, each having barrier layers of which a third barrier layer 227 of the third channel 226 is labeled. Again, the third channels 226 and 228 can be deposited either by single or dual damascene processes. A capping layer 230 is deposited over the third channel dielectric layer 224 and the third channels 226 and 228.

The above structure may generally be described as an interdigitated comb structure.

The semiconductor wafer 200 having the interdigitated comb structure may be tested in a number of different ways, which would be evident to one who is skilled in the art.

For example, it would be possible to determine the characteristics, such as the integrity of the combination of the first intermediate stop layer 210, the first intermediate dielectric layer 212, and the barrier layer 217 by testing between the first channel 206 and the second channel 216.

A voltage is applied across portions of the semiconductor wafer 200 from a positive voltage source 240 connected to the first channel 206 to a ground 242 connected to the second channel 216. The electrical field causes the conductor ions to diffuse from the conductor core of the first channel 206 through the first intermediate stop layer 210 into the first intermediate dielectric layer 212. By placing an ammeter 244 across the positive voltage source 240 to the ground 242 in parallel with the capacitor formed by the first and second channels 206 and 216 and the first intermediate dielectric layer 212, leakage current can be easily measured and the integrity of the first intermediate stop layer 210, the first intermediate dielectric layer 212, and the barrier layer 217 can be characterized.

In another example, a voltage is applied across portions of the semiconductor wafer 200 from a positive voltage source 246 connected to the second channel 218 to a ground 248 connected to the third channel 226. The electrical field causes the conductor ions to diffuse from the conductor core of the second channel 218 through weakest volume among the second intermediate stop layer 220, the second intermediate dielectric layer 222, and the third barrier 227 of the third channel 226. Using an ammeter 250, leakage current can be easily measured and the integrity can be characterized.

In a further example, a voltage is applied across portions of the semiconductor wafer 200 from a positive voltage source 252 connected to the first channel 208 to a ground 254 connected to another first channel 206. The electrical field causes the conductor ions to diffuse from the conductor core of the first channel 208 through weakest volume among the first barrier layer 209, the first channel dielectric layer 204, and the first barrier layer 207 to the first channel 206. Using an ammeter 256, leakage current can be easily measured and the integrity can be characterized.

Thus by measuring leakage levels between various permutations and combinations of different levels, the weakest diffusion path can be measured as well as the best combination of materials.

In various embodiments, the diffusion barrier layers are of materials such as tantalum (Ta), titanium (Ti), tungsten (W), alloys thereof, and compounds thereof. The seed layers (where used) are of materials such as copper (Cu), gold (Au), silver (Ag), alloys thereof and compounds thereof with one or more of the above elements. The conductor cores with or without seed layers are of conductor materials such as copper, aluminum (Al), gold, silver, compounds thereof, and combinations thereof. The dielectric layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$) or silicon oxynitride (SiON).

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. A method of testing an integrated circuit interconnect comprising:

providing a semiconductor substrate;

providing a source of electrical potential;

providing an electrical ground;

forming a dielectric layer on the semiconductor substrate;

forming first and second openings in the dielectric layer;

depositing first and second barrier layers to line the respective first and second openings;

depositing first and second conductor cores over the respective first and second barrier layers to fill the respective first and second openings; the first conductor core connected to the source of electrical potential, the second conductor core connected to the electrical ground; and providing a current measuring device to measure leakage current flow through the dielectric layer between the first and second conductor cores.

2. The method as claimed in claim 1 wherein forming the dielectric layer includes depositing successive first, second, and third dielectric layers; and forming the first and second openings form the first opening in the first dielectric layer and the second opening in the third dielectric layer.

3. The method as claimed in claim 2 including forming an intermediate stop layer on the first dielectric layer.

4. The method as claimed in claim 1 wherein forming the dielectric layer forms a low dielectric constant material.

5. The method as claimed in claim 1 wherein depositing the first and second barrier layers deposits a material selected from a group consisting of titanium, tantalum, tungsten, an alloy thereof, and a compound thereof.

6. The method as claimed in claim 1 wherein depositing the first and second conductor cores deposits a material selected from a group consisting of copper, aluminum, gold, silver, a compound thereof, and a combination thereof.

7. An integrated circuit test system comprising:
    a semiconductor substrate;
    a dielectric layer on the semiconductor substrate having first and second openings provided therein;
    first and second barrier layers lining the respective first and second openings;
    first and second conductor cores over the respective first and second barrier layers filling the respective first and second openings;
    a source of electrical potential for connection to the first conductor core;
    an electrical ground for connection to the second conductor core; and
    a current measuring device for measuring current flow through the dielectric layer between said first and second conductor cores.

8. The integrated circuit test system as claimed in claim 7 wherein the dielectric layer includes successively deposited first, second, and third dielectric layers, the first opening is in the first dielectric layer, and the second opening is in the third dielectric layer.

9. The integrated circuit test system as claimed in claim 8 including an intermediate stop layer over the first dielectric layer.

10. The integrated circuit test system as claimed in claim 7 wherein the dielectric layer is a low dielectric constant material.

11. The integrated circuit test system as claimed in claim 7 wherein the first and second barrier layers are of a material selected from a group consisting of titanium, tantalum, tungsten, an alloy thereof, and a compound thereof.

12. The integrated circuit test system as claimed in claim 7 wherein the first and second conductor cores are of a material selected from a group consisting of copper, aluminum, gold, silver, a compound thereof, and a combination thereof.

* * * * *